(12) United States Patent
Imori

(10) Patent No.: US 6,780,467 B2
(45) Date of Patent: Aug. 24, 2004

(54) PLATING PRETREATMENT AGENT AND METAL PLATING METHOD USING THE SAME

(75) Inventor: Toru Imori, Kitaibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 0 days.

(21) Appl. No.: 10/169,894

(22) PCT Filed: Jan. 5, 2001

(86) PCT No.: PCT/JP01/00022

§ 371 (c)(1),
(2), (4) Date: Jul. 8, 2002

(87) PCT Pub. No.: WO01/81652

PCT Pub. Date: Nov. 1, 2001

(65) Prior Publication Data

US 2002/0192379 A1 Dec. 19, 2002

(30) Foreign Application Priority Data

Apr. 25, 2000 (JP) ........................................ 2000-124176

(51) Int. Cl.⁷ ............................. B06D 3/10; B05D 7/00; B05D 1/18; C09D 5/00
(52) U.S. Cl. ....................... 427/304; 427/305; 427/437; 427/438; 427/212; 106/1.05; 106/1.11
(58) Field of Search ................................ 477/304, 305, 477/437, 435; 106/1.05, 1.11; 427/212

(56) References Cited

FOREIGN PATENT DOCUMENTS

| EP | 0328263 | | 1/1989 | |
|---|---|---|---|---|
| EP | 0328263 A | * | 8/1989 | ........... C23C/18/28 |
| JP | S59-052701 | | 12/1984 | |
| JP | S60-173191 | | 9/1985 | |
| JP | S60-181294 | | 9/1985 | |
| JP | S61-194183 | | 8/1986 | |
| JP | S63-227784 | | 9/1988 | |
| JP | 63-227784 A | * | 9/1988 | ........... C23C/18/18 |
| JP | S64-068478 | | 3/1989 | |
| JP | H03-044149 | | 7/1991 | |
| JP | H06-256358 | | 9/1994 | |
| JP | H10-030188 | | 2/1998 | |
| JP | 10-030188 A | * | 2/1998 | ........... C23C/18/50 |
| JP | 11-092482 | | 4/1999 | |

* cited by examiner

Primary Examiner—Michael Barr
(74) Attorney, Agent, or Firm—Flynn, Thiel, Boutell & Tanis, P.C.

(57) ABSTRACT

The present invention provides a method for metal plating which makes it possible to perform electroless plating in a favorable manner even on materials difficult to apply electroless plating, and a pretreatment agent for this method. An article to be plated is treated with a pretreatment agent which has been prepared by mixing a solution of a silane coupling agent having a metal-capturing functional group in its molecule and a solution containing a metal that shows catalytic activity in the deposition of a plating metal such as copper, nickel or the like from an electroless plating solution onto the surface of an article to be plated so that the above-mentioned metal is captured by the above-mentioned silane coupling agent, and then adding a reducing agent. Afterward, electroless plating is performed so that a metal thin film is formed on the surface of the article pretreated above. Then, desired metal plating can be performed.

14 Claims, No Drawings

PLATING PRETREATMENT AGENT AND METAL PLATING METHOD USING THE SAME

TECHNICAL FIELD

The present invention relates to a plating pretreatment agent used for the metal plating of surfaces of low-conductivity materials, mirror-surface articles, powders and the like by electroless plating, and a metal plating method using this agent.

BACKGROUND ART

The electroless metal plating method is one method for forming metal coating films on substrates that do not possess conductivity. In performing electroless plating, a method known as activation in which a precious metal such as palladium or the like is caused to adhere to a substrate beforehand (as a catalyst is generally used as an electroless plating pretreatment. In the past, methods in which Pd is adsorbed by an immersion treatment in an aqueous solution of $PdCl_2$ following a treatment with a hydrochloric acid aqueous solution of $SnCl_2$, and methods in which Pd is supported on the surface by means of a colloid solution of Sn and Pd, have been used as such activation methods. Such methods involve numerous problems such as the use of highly toxic Sn, the need for a complicated treatment process and the like. Recently, therefore, various methods which use a silane coupling agent that has functional groups capable of forming a complex with precious metals such as Pd or the like that constitute catalysts for electroless plating have been proposed as methods for supporting such precious metals on the surface being treated (Japanese Patent Publication No. S59-52701, Japanese Patent Application Laid-Open No. S60-181294, Japanese Patent Application Laid-Open No. S61-194183, Japanese Patent Publication No. H3-44149). Among these methods, there are methods in which separate treatments are performed using a plating catalyst fixing agent and a plating catalyst, i.e., methods in which the precious metal ions that constitute the catalyst are supported after a coupling agent has been adsorbed on the article to be plated. In such cases, however, depending on the material of the article being plated, it is sometimes difficult to form a uniform plating film with good adhesion, possibly due to modification of the surface of the article being plated by the coupling agent treatment, or due to the fact that the precious metal ions cannot be efficiently supported. Furthermore, depending on the material of the article being plated and the plating conditions, it has also been impossible in some cases to obtain a uniform plating film in the case of using a mixed solution of an aminosilane coupling agent and palladium chloride, either for the above-mentioned reasons or because the palladium does not show a sufficient catalytic activity.

DISCLOSURE OF THE INVENTION

In view of the foregoing, it is an object of the present invention to provide a metal plating method using a novel electroless plating that allows ideal electroless plating to be performed even on materials which have difficulties in the application of conventional electroless plating. Another object of the present invention is to provide a metal plating pretreatment agent for use in the above-mentioned electroless plating. In particular, the present invention makes it possible to accomplish uniform plating with good adhesion even using a plating solution with a weak reducing power such as a copper plating solution or the like.

As a result of diligent research conducted in order to solve the above-mentioned technical problems, the present inventors discovered that electroless plating can be performed in an ideal manner and by means of a simple process even on materials to be plated in which it has been difficult to use conventional electroless plating, by subjecting the article that is to be plated to a surface treatment with a pretreatment agent which has been prepared by capturing a metal with a silane coupling agent which has a metal-capturing functional group or groups in its molecule, and then adding a reducing agent. This discovery led to the perfection of the present invention.

Specifically, the present invention provides:

(1) A method for metal plating which is characterized in that the method comprises treating an article to be plated with a pretreatment agent, which has been prepared by capturing a metal with a silane coupling agent having a metal-capturing functional group in its molecule, then adding a reducing agent and performing electroless plating.

(2) The method for metal plating according to (1) above, which is characterized in that the metal-capturing functional group is an amine.

(3).The method for metal plating according to (1) above, which is characterized in that the metal-capturing functional group is an imidazole.

(4) The method for metal plating according to (1) above, which is characterized in that the metal is provided in the form of a palladium compound.

(5) The method for metal plating according to (1) which is characterized in that the silane coupling agent having a metal-capturing functional group in its molecule is a silane coupling agent obtained by the reaction of an azole compound and an epoxysilane type compound.

(6) The method for metal plating according to (1) above, which is characterized in that the reducing agent is dimethylamine borane.

(7) The method for metal plating according to (1) above, wherein the metal plating is copper or nickel.

(8) A pretreatment agent for metal plating which is characterized in that this agent has been prepared by capturing a metal with a silane coupling agent having a metal-capturing functional group in its molecule, and then adding a reducing agent.

The present invention is characterized in that a specified silane coupling agent, i.e., a silane coupling agent in which a metal constituting a catalyst with a high activity is captured by a metal-capturing functional group, is used, and a reducing agent is added to this coupling agent.

BEST MODE FOR CARRYING OUT THE INVENTION

In the metal plating pretreatment agent of the present invention, the activity of the catalyst can be increased by the addition of a reducing agent, so that reduction can be accomplished using even a plating solution with a weak reducing power.

Nitrogen-containing heterocyclic compounds such as imidazoles or the like, including primary amines, secondary amines and tertiary amines, can be used as the metal-capturing functional groups.

In the present invention, precious metals are desirable as the metals that constitute high-activity catalysts; examples of precious metal compounds that can be used include chlorides, hydroxides, oxides, sulfates and amine complexes (ammonium salts or the like) of palladium, silver, platinum, gold and the like, which show catalytic activity when copper, nickel or the like is deposited on the surface of the article being plated from an electroless plating solution. Among these compounds, palladium chloride is especially desirable. The capture of the precious metal by the above-mentioned silane coupling agent is accomplished by mixing solutions of the respective compounds. The same solvent as that used for the pretreatment agent (described later) can be used as the solvent of the above-mentioned solutions.

The silane coupling agent with a metalcapturing functional group that is used in the present invention may be any silane coupling agent that has the above-mentioned metal-capturing functional group or groups; there are no particular restrictions on this coupling agent. Silane coupling agents which have nitrogen-containing heterocyclic azole compounds such as imidazole or the like are especially desirable.

As a result of the presence of nitrogen-containing hetero-rings in the molecule, an electron state and orientation that effectively manifest the activity of the plating catalyst can be obtained through the conjugate and aromatic properties of the nitrogen-containing hetero-rings; furthermore, since the agent is a silane coupling agent, tight adhesion of the agent to an article being plated can be realized.

Examples of such nitrogen-containing heterocyclic azole compounds include imidazole, oxazole, thiazole, selenazole, pyrazole, isooxazole, isothiazole, triazole, oxadiazole, thiadiazole, tetrazole, oxatriazole, thiatriazole, pentazole, indazole, benzimidazole, benzotriazole and the like. The present invention is not limited to these compounds; however, compounds that have imidazole rings are especially desirable.

Furthermore, the silane coupling agent onto which the metal-capturing functional group(s) is(are) introduced is a compound which has an —$SiX_1X_2X_3$ group; here, $X_1$, $X_2$ and $X_3$ indicate alkyl groups, halogen atoms, alkoxy groups or the like, and may be any functional group that can be fixed to the article that is being plated. $X_1$, $X_2$ and $X_3$ may be the same or different. The silane coupling agent with metal-capturing functional groups that is used in the present invention is obtained (for example) by reacting the above-mentioned nitrogen-containing heterocyclic compound with an epoxysilane type compound. Such silane coupling agents are described, for example in Japanese Patent Application Laid-Open No. H6-256358, and have already been known.

In the metal plating method of the present invention, there are no restrictions on the properties of the material to be plated. For example, the plating method of the present invention can be applied to inorganic materials such as glass, ceramics or the like, plastic materials such as polyesters, polyamides, polyimides, fluororesins or the like, or films, sheets or fibers consisting of such materials, insulating materials such as insulating boards constituted by epoxy resins or the like, which may be reinforced by glass cloth substrates or the like if necessary, or semiconductors such as Si wafers or other articles having a low conductivity. The present invention can be used in a favorable manner even if the article to be plated is a mirror-surface article such as a glass plate, Si wafer or other semiconductor substrate, or a powdered material. Examples of such powdered materials include glass beads, powdered molybdenum disulfide, powdered magnesium oxide, powdered graphite, powdered SiC, powdered zirconium oxide, powdered alumina, powdered silicon oxide, mica flakes, glass fibers, silicon nitride, powdered Teflon and the like.

In cases where the material that is to be subjected to electroless plating is treated with the above-mentioned pretreatment agent which has been prepared by capturing a metal with a silane coupling agent having at least one metal-capturing functional group in its molecule and then adding a reducing agent, the pretreatment agent can be used in the form of a solution prepared by dissolving this agent in an appropriate solvent, e.g., water, methyl alcohol, ethyl alcohol, 2-propanol, ethylene glycol, polyethylene glycol or the like, or a solvent prepared by mixing such solvents. Especially in cases where an aqueous solution is used, the pH has a great effect on the plating characteristics. From the standpoint of the complex-forming capacity of nitrogen that fixes the plating catalyst, a high pH is preferable; however, since the stability of the solution drops in the case of a high pH, a pH in the range of 1.5 to 7 is desirable.

In regard to the method used to treat the article of plating with the pretreatment agent, methods such as immersion, coating with a brush, spin-coating and the like are commonly used. However, the present invention is not limited to such methods; any method which causes an amine compound with precious metal ions and alkoxysilyl groups to adhere to the surface of the article to be plated may be used. In this case, treatment at a temperature of 30 to 80° C. is effective in improving the adhesion of the reagent.

There are no restrictions on the concentration of the silane coupling agent in the treatment solution; however, a concentration of 0.001 to 10 wt % is easy to use. In cases where the concentration is less than 0.001 wt %, the amount of compound adhering to the surface of the substrate tends to drop, so that plating cannot be uniformly performed. On the other hand, if the concentration exceeds 10 wt %, the amount of adhering compound becomes excessive, so that drying becomes difficult and aggregation tends to occur in cases where the article being plated is a powder.

Sodium hypophosphite, sodium borohydride, dimethylamine borane and the like may be cited as examples of the above-mentioned reducing agent.

If the amount of reducing agent added is too small, the activation of the catalyst is insufficient; on the other hand, if the amount added is too large, the catalyst is converted into a metal and becomes a precipitate. It is desirable that the reducing agent be added at the rate of 0.01 to 1000 mg/L, preferably 0.1 to 500 mg/L to the solution in which the silane coupling agent having a metal-capturing functional group or groups in its molecule and the metal salt that acts as the plating catalyst are present. It goes without saying that the amount of reducing agent added depends on the type of reducing agent and the amount of the metal salt.

The reducing agent is added at room temperature under agitation. The reducing agent may also be added under heating.

In order to volatilize the solvent used following the surface treatment, it is sufficient to dry the surface by heating the solvent to a temperature exceeding the volatilization temperature of the solvent. However, it is desirable that heating be further performed for 3 to 60 minutes at 60 to 120° C.

In cases where water is used as the solvent, the drying process can be omitted, and plating can be performed merely by rinsing with water following the surface treatment. In such a case, however, it is necessary to perform sufficient rinsing with water so that the catalyst is not carried into the plating solution.

In regard to the temperature at which the pretreatment is performed, room temperature is sufficient; however, depending on the article to be plated, there are also cases in which heating is effective.

Naturally, the article to be plated may also be cleaned prior to the plating pretreatment. Especially in cases where good adhesion is required, a conventional etching treatment by means of chromic acid or the like may also be used.

Furthermore, it would also be possible to perform electroless plating first so that a metal thin film is formed, thus endowing the non-conductive substrate with a certain degree of conductivity, and then to perform electroplating or substitution plating with a base metal.

After a metal thin film is performed by electroless plating according to the present invention, a metal plating of copper, nickel, cobalt, tin, gold or the like can be applied.

The present invention will be specifically described in terms of examples below.

EXAMPLES

The stability of the pretreatment solution was judged by adding palladium chloride and a reducing agent, and visually inspecting precipitates or products after the mixture was allowed to stand for one day at room temperature. The adhesion of the plating film was judged according to the coverage rate and the adhesion to the substrate following the pretreatment. All treatments with the plating pretreatment agent were performed under heating at 60° C. Furthermore, the pH was adjusted using an aqueous solution of hydrochloric acid. Moreover, the above-mentioned adhesion was judged by means of a tape stripping test.

Example 1

An aqueous solution of palladium chloride was added under agitation at room temperature to a 0.05 wt % aqueous solution of an equimolar reaction product of imidazole and γ-glycidoxypropyltrimethoxysilane, thus preparing a solution with a palladium chloride concentration of 100 mg/L. The pH of this solution was adjusted to 2.4 using an aqueous solution of hydrochloric acid. An aqueous solution of dimethylamine borane was added to this solution at a rate of 1 mg/L. In regard to stability, the solution was allowed to stand for one day, and it was confirmed that the solution was stable. This solution was heated to 60° C., and a polyester cloth was immersed in the solution for 5 minutes. Then, following thorough rinsing with water, electroless copper plating was formed at 60° C. using a copper plating solution NKM-554 (manufactured by Nikko Metal Plating Co., Ltd.). The polyester fibers were copper-plated overall with good adhesion.

Example 2

Polyester fibers were immersed for 5 minutes at room temperature in the plating pretreatment agent prepared in Example 1 and then thoroughly rinsed with water. Next, electroless nickel plating was performed at 75° C. using a nickel plating solution Nikom 7N (manufactured by Nikko Metal Plating Co., Ltd.) heated to 70° C. The polyester fibers were nickel-plated overall with good adhesion.

Example 3

A nylon yarn was immersed for five minutes in the plating pretreatment agent prepares in Example 1, and then thoroughly rinsed with water. Next electroless nickel plating was performed at 75° C. using plating solution Nikom 7N (manufactured by Nikko Metal Plating., Ltd.) heated to 70° C. The yarn was plated overall with good adhesion.

Example 4

An aqueous solution of palladium chloride was added under agitation at room temperature to a 0.02 wt % aqueous solution of an equimolar reaction product of imidazole and γ-glycidoxypropyltrimethoxysilane, thus preparing a solution with a palladium chloride concentration of 40 mg/L. An aqueous solution of dimethylamine borane was added to this solution in an amount of 45 mg/L. This solution was heated to 60° C., and alumina which had been surface-treated with sodium hydroxide was immersed in the solution for 10 minutes and rinsed with water. Afterward, electroless copper plating was performed at 72° C. using a copper plating solution KC-500 (manufactured by Nikko Metal Plating Co., Ltd.). The alumina was plated overall with good adhesion.

Comparative Example 1

An aqueous solution of palladium chloride was added under agitation at room temperature to a 0.05 wt % aqueous solution of an equimolar reaction product of imidazole and γ-glycidoxypropyltrimethoxysilane, thus preparing a solution with a palladium chloride concentration of 100 mg/L. The pH of this solution was adjusted to 2.4 using an aqueous solution of hydrochloric acid. This solution was heated to 60° C., and a polyester cloth was immersed for 5 minutes in the solution and thoroughly rinsed with water. Afterward, electroless plating was performed at 60° C. using a copper plating solution NKM-554 (manufactured by Nikko Metal Plating Co., Ltd.). The polyester cloth was not plated.

INDUSTRIAL APPLICABILITY

As was described above, the plating method of the present invention makes it possible to perform plating, by means of an easy process, even on substrates such as plastic materials that do not have conductivity, or films and fibers of such materials, semiconductors with low conductivity such as Si wafers or the like, mirror-surface articles and powders or the like, that have conventionally been difficult to plate. In particular, the present invention makes it possible to perform uniform plating with good adhesion even in cases where plating solutions with a weak reducing power, such as copper plating solutions or the like, are used.

What is claimed is:

1. A method of forming a metal plating on an article, comprising the steps of capturing a metal by a silane coupling agent having a metal-capturing functional group in its molecule and adding a reducing agent to the silane coupling agent having the captured metal to form a pretreatment agent, contacting the article with the pretreatment agent and performing electroless plating on the article.

2. The method according to claim 1, characterized in that the metal-capturing functional group is an amine.

3. The method according to claim 1, which characterized in that the metal-capturing functional group is an imidazole.

4. The method according to claim 1 characterized in that the captured metal is provided in the form of a palladium compound.

5. The method according to claim 1 characterized in that the silane coupling agent having at least metal-capturing functional group in its molecule is a silane coupling agent obtained by the reaction of an azole compound and an epoxysilane compound.

6. The method according to claim 1 characterized in that the reducing agent is dimethylamine borane.

7. The method according to claim 1, wherein wherein a copper or nickel metal plating is formed on the article.

8. The method according to claim 1, characterized in that the article is selected from the group consisting of glass plate, a semiconductor substrate and a powdered material.

9. A pretreatment agent for metal plating which is characterized in that the agent has been prepared by capturing a metal with a silane coupling agent having a metal-capturing functional group in its molecule, and then adding a reducing agent.

10. The pretreatment agent according to claim 9, characterized in that the metal-capturing functional group is an imidazole.

11. The pretreatment agent according to claim 9, characterized in that the silane coupling agent having at least a metal-capturing functional group in its molecule is a silane coupling agent obtained by the reaction of an azole compound and an epoxysilane compound.

12. The pretreatment agent according to claim 9, characterized in that the captured metal is a palladium compound.

13. The pretreatment agent according to claim 9, characterized in that the reducing agent is dimethylamine borane.

14. The pretreatment agent according to claim 9, characterized in that the metal-capturing functional group is an amine.

* * * * *